United States Patent
Cornelius

(10) Patent No.: US 7,446,389 B2
(45) Date of Patent: Nov. 4, 2008

(54) SEMICONDUCTOR DIE PACKAGE WITH INTERNAL BYPASS CAPACITORS

(75) Inventor: William P. Cornelius, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 369 days.

(21) Appl. No.: 11/178,152

(22) Filed: Jul. 8, 2005

(65) Prior Publication Data

US 2005/0280145 A1 Dec. 22, 2005

Related U.S. Application Data

(63) Continuation-in-part of application No. 10/871,845, filed on Jun. 17, 2004, now Pat. No. 7,268,419.

(51) Int. Cl.
*H01L 27/08* (2006.01)

(52) U.S. Cl. .............................. 257/532; 257/E23.079; 257/528; 257/691; 257/723; 361/782

(58) Field of Classification Search .......... 257/E23.079, 257/723, 724, 691, 678, 700, E23.021, E23.062, 257/684–686, 532, 528; 361/782, 783
See application file for complete search history.

(56) References Cited

U.S. PATENT DOCUMENTS 5,939,783 A * 8/1999 Laine et al. ................. 257/702
6,346,743 B1 * 2/2002 Figueroa et al. ............. 257/723
6,407,929 B1 * 6/2002 Hale et al. ................... 361/763
6,970,362 B1 * 11/2005 Chakravorty ................ 361/782
7,132,743 B2 * 11/2006 Palanduz .................... 257/703
2003/0102555 A1 * 6/2003 Patel et al. .................. 257/723

* cited by examiner

*Primary Examiner*—Chris C. Chu
(74) *Attorney, Agent, or Firm*—Park, Vaughan & Fleming LLP

(57) ABSTRACT

One embodiment of the present invention provides an apparatus that reduces voltage noise for an integrated circuit (IC) device. This apparatus includes a package which is configured to be sandwiched between the IC device and a circuit board. This package has a bottom surface, which is configured to receive electrical connections for power, ground and other signals from the circuit board, and a top surface, which is configured to provide electrical connections for power, ground and the other signals to the IC device. A plurality of bypass capacitors are integrated into the package and are coupled between the power and ground connections for the IC device, so that the plurality of bypass capacitors reduce voltage noise between the power and ground connections for the IC device.

5 Claims, 4 Drawing Sheets

SEMICONDUCTOR DIE PACKAGE WITH INTERNAL BYPASS CAPACITORS

RELATED APPLICATION

This application is a continuation-in-part of a U.S. patent application Ser. No. 10/871,845, filed 17 Jun. 2004 now U.S. Pat. No. 7,268,419 entitled, "Interposer Containing Bypass Capacitors for Reducing Voltage Noise in an IC Device," by inventor William P. Cornelius. This application hereby claims priority under 35 U.S.C. §120 to the above-listed patent application. Moreover, the above-listed patent application is hereby incorporated by reference.

BACKGROUND

1. Field of the Invention

The present invention relates to techniques for reducing voltage noise in electrical circuits. More specifically, the present invention relates to a package for a semiconductor die which contains bypass capacitors that operate to reduce voltage noise on an integrated (IC) circuit device, such as a microprocessor chip.

2. Related Art

As microprocessors become progressively faster, voltage noise in the microprocessor core is becoming a significant factor in limiting system performance. Higher operating frequencies are causing circuitry within the microprocessor core to switch at faster rates. This faster switching can result in significant "step currents," which are caused for example by changing code patterns, sleep cycles, etc. Step currents can cause a significant voltage drop on the microprocessor die which is proportionate to L(di/dt), where L is the loop inductance from core power to core ground as seen from the microprocessor die, where di is the step current, and where dt is the time frame over which the step current occurs. If this voltage drop (or any other form of voltage noise) causes the voltage at the microprocessor core to drop below a minimum voltage, $V_{min}$, an error in the circuitry can potentially arise. Hence, the voltage drop at the microprocessor core caused by step currents can limit the maximum operating frequency, $F_{max}$, of the microprocessor.

Furthermore, as microprocessors have become faster, operating voltages within the microprocessor core have decreased. This lower operating voltage makes it possible for circuitry within the microprocessor core to switch more rapidly. However, it also makes the circuitry more sensitive to small amounts of voltage noise.

Voltage noise can be somewhat mitigated by using bypass capacitors to decouple to power and ground pins on the microprocessor die. For example, FIG. 1 illustrates how a microprocessor die 102 is integrated into a conventional microprocessor system. As is illustrated in FIG. 1, microprocessor die 102 is electrically coupled to a package 104 through a number of microbumps (or solder balls) on the backside of die 102. Package 104 is also electrically coupled to circuit board 106 through larger solder balls on the backside of package 104.

Note that electrical signals from die 102 flow through vias in package 104 to conductors within circuit board 106. In particular, power and ground lines from die 102 flow through package 104 into circuit board 106. In additional to connecting to power and ground planes within circuit board 106, these power and ground lines also flow through vias in circuit board 106 and attach to bypass capacitors 108 on the backside of circuit board 106.

Note that the larger current loops, which flow from die 102 through package 104 and through circuit board 106 to bypass capacitors 108, cause a significant voltage droop due to loop inductance, L, that can cause increased noise at higher operating frequencies (i.e. signals with low dt). Note that loop inductance is due to the physical structure's metallic conductor dimensions, which must support current flow. Although the current flow does not cause inductance directly, changes in the current flow provide the di in the relationship $$V_{voltage\_droop} = L\, di/dt.$$

To reduce inductance, some systems increase the size of the capacitance within the die itself to increase the dt term to acceptable levels for overall voltage droop. They also provide low inductance loops to board-level, or module-level decoupling. Unfortunately, providing capacitance within the die involves using gate oxide capacitors, which have leakage modes. This is highly undesirable because semiconductor technology is at the point where leakage current dominates power dissipation.

Hence, what is needed is a method and an apparatus for lowering loop inductance for bypass capacitors without the above-described problems.

SUMMARY

One embodiment of the present invention provides an apparatus that reduces voltage noise for an integrated circuit (IC) device. This apparatus includes a package which is configured to be sandwiched between the IC device and a circuit board. This package has a bottom surface, which is configured to receive electrical connections for power, ground and other signals from the circuit board, and a top surface, which is configured to provide electrical connections for power, ground and the other signals to the IC device. A plurality of bypass capacitors are integrated into the package and are coupled between the power and ground connections for the IC device, so that the plurality of bypass capacitors reduce voltage noise between the power and ground connections for the IC device.

In a variation on this embodiment, the package includes: a substrate comprised of a bulk material; and top buildup layers on the top surface of the package, which include traces for routing power, ground and other signals between the IC device and vias that pass through the substrate. In this variation, the bypass capacitors are integrated into the substrate below the top buildup layers.

In a further variation, the package additionally includes bottom buildup layers on the bottom surface of the package, which include traces for routing power, ground and other signals between the vias that pass through the substrate and the circuit board.

In a further variation, the top and bottom buildup layers are comprised of an organic material.

In a further variation, the substrate is a printed circuit board substrate, or is comprised of a copper bulk material.

In a variation on this embodiment, the bypass capacitors are electrically coupled to power and ground conductors on the top surface of the package, so that step currents caused by the IC device (which is coupled to the top surface of the package) enter and leave the bypass capacitors through the top surface of the package.

In a variation on this embodiment, the internal planes of the bypass capacitors extend downward from the top surface of the package in a direction that is normal to the top surface of the package.

In a variation on this embodiment, the internal planes of the bypass capacitors are parallel to the top surface of the package.

In a variation on this embodiment, the IC device is a "flip chip" semiconductor die.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Microprocessor System

Figure 1:
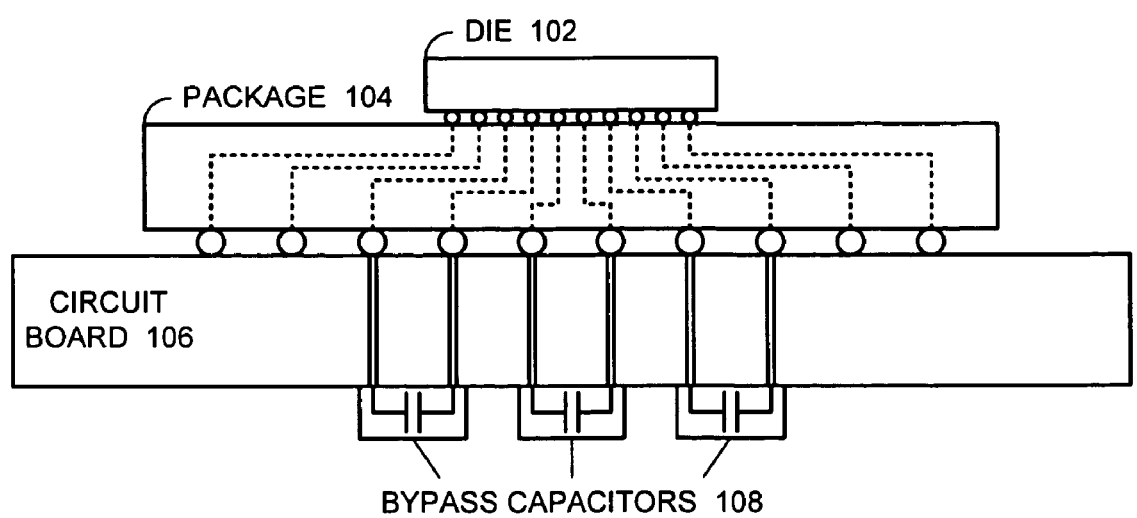
FIG. 1 illustrates how a microprocessor die and bypass capacitors are integrated into a conventional microprocessor system.
Figure 2A:
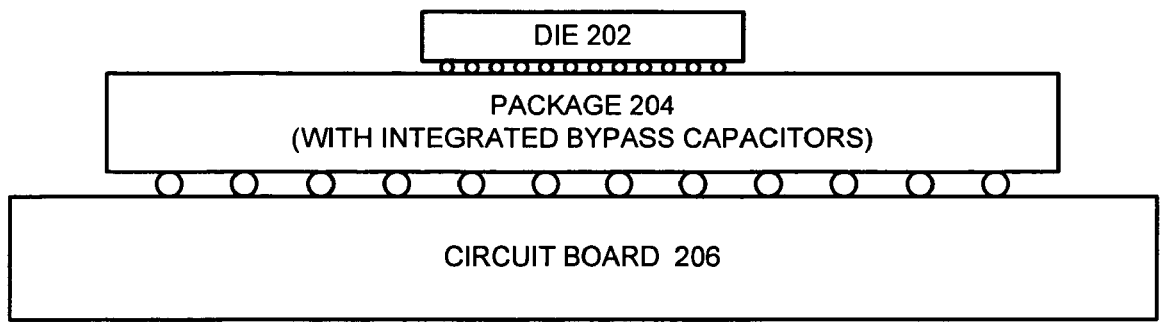
FIG. 2A illustrates how a package, which includes bypass capacitors, is used to couple a microprocessor die to a circuit board in accordance with an embodiment of the present invention.

FIG. 2A illustrates how a package 204, which includes bypass capacitors, is used to couple a microprocessor die to a circuit board in accordance with an embodiment of the present invention. Like the system illustrated in FIG. 1, this system includes a microprocessor die 202, which is attached to a package 204. Package 204 is correspondingly attached to circuit board 206.

However, unlike the system illustrated in FIG. 1, package 204 contains a number of bypass capacitors 212 and 214 for decoupling power and ground lines that are attached to pins on microprocessor die 202. Note that bypass capacitors 212 and 214 within package 204 are located closer to microprocessor die 202 than bypass capacitors 108 illustrated in FIG. 1, which are located on the backside of circuit board 106. This means that bypass capacitors 212 and 214 provide a lower $V_{dd}$ to $V_{ss}$ loop size (and hence a lower loop inductance) than can be provided by bypass capacitors 108, which are located on the backside of circuit board 106.

Figure 2B:
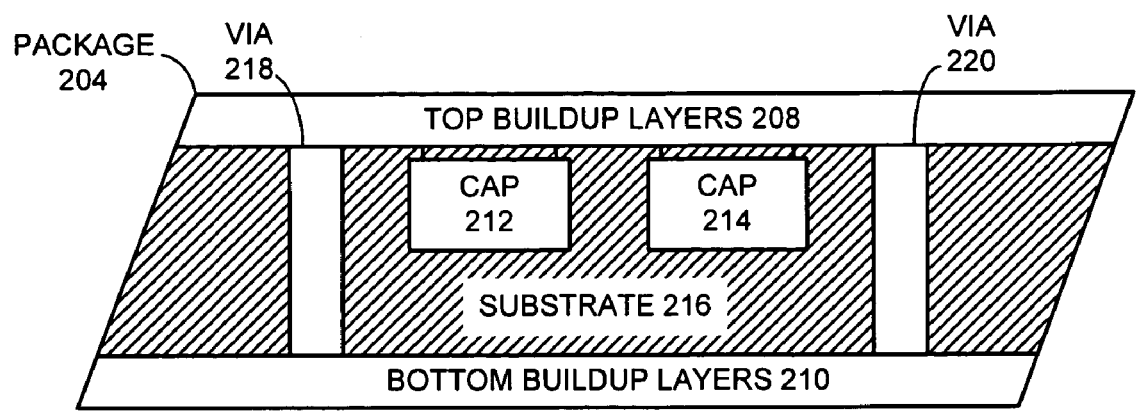
FIG. 2B illustrates the internal structure of a package which includes bypass capacitors in accordance with an embodiment of the present invention.

In one embodiment of the present invention, package 204 is constructed by fabricating buildup layers 208 and 210 on the top surface and bottom surface, respectively, of a substrate 216 (see FIG. 2B). Top buildup layers 208 include traces for routing power, ground and other signals between microprocessor die 102 and vias 218 and 220 that pass through substrate 216. Similarly, bottom buildup layers 210 include traces for routing power, ground and other signals between vias 218 and 220 in substrate 216 and circuit board 206.

In one embodiment of the present invention, the top and bottom buildup layers 208 and 210 are composed of a dielectric material (possibly an organic material), and the substrate 216 can be a printed circuit board substrate, or can be comprised of a copper bulk material.

Substrate 216 contains bypass capacitors 212 and 214, which are integrated into substrate 216 between top buildup layers 208 and bottom buildup layers 210. (Note that although only two bypass capacitors are illustrated in FIG. 2A, there are likely to be dozens, hundreds or even thousands of bypass capacitors within package 204.) Bypass capacitors 212 and 214 are coupled between the power and ground connections for microprocessor die 202, so that bypass capacitors 212 and 214 reduce voltage noise between the power and ground connections for microprocessor die 202.

These bypass capacitors 212 and 214 can have "surface-parallel" planes, which are parallel to the surface of package 204, or alternatively "surface-normal" planes, which are normal to the surface of package 204. These different types of capacitors are described in more detail below with reference to FIGS. 3-5.

Bypass capacitors 212 and 214 can be incorporated into package 204 through the following operations. First, voids are created within substrate 216, for example through mechanical techniques, such as drilling, or through chemical techniques, such as etching.

Next, bypass capacitors 212 and 214 are inserted into the voids. For example, in one embodiment of the present invention, bypass capacitors 212 and 214 are embedded in plastic modules which are "snapped" into substrate 216.

Finally, the top and bottom buildup layers 208 and 210 are fabricated on the top and bottom surfaces, respectively, of substrate 216.

Current Loops through a Bypass Capacitor with Surface-Parallel Planes

Bypass capacitors with surface-parallel planes can create a large amount of loop inductance at higher frequencies. For example, FIG. 3 illustrates a current loop (indicated by the dashed line), which flows through a bypass capacitor 108 that has planes which are parallel to the top surface of package 204

Figure 3:
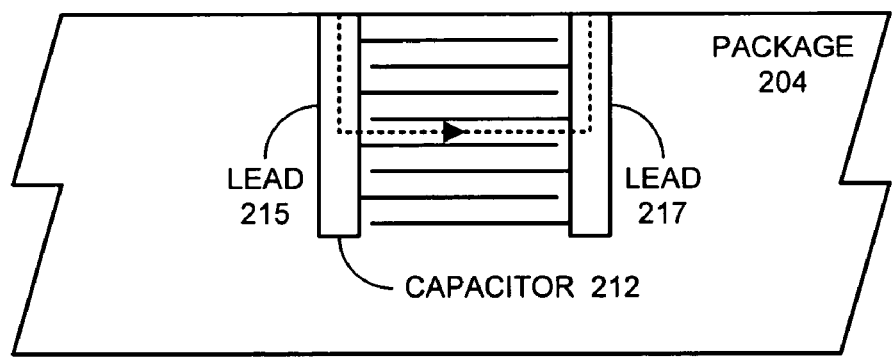
FIG. 3 illustrates how current flows through a bypass capacitor with surface-parallel planes in accordance with an embodiment of the present invention.

In FIG. 3, a step current that originates from a microprocessor die flows into package 204 and into lead 215 of bypass capacitor 212. Lead 214 is attached to internal planes within bypass capacitor 212. A return current from other internal planes within bypass capacitor 212, which are attached to the other lead 217 of bypass capacitor 212, flows out of package 204 and back to the microprocessor die.

Note that this current loop flows through the entire length of bypass capacitor 212. Furthermore, if bypass capacitor 212 is increased in size by adding new more internal planes, these additional internal planes will be farther from the microprocessor die, which increases the size of the current loops through these additional planes.

Current Loops through a Bypass Capacitor with Surface-Normal Planes

Figure 4:
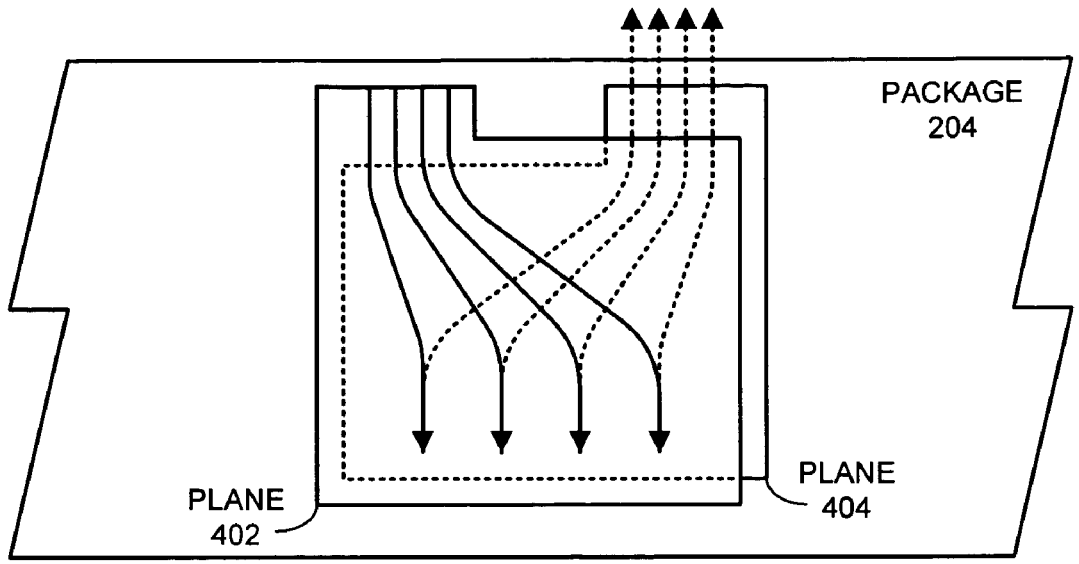
FIG. 4 illustrates how current flows through a bypass capacitor with surface-normal planes in accordance with an embodiment of the present invention.

FIG. 4 illustrates how current flows through a bypass capacitor with surface-normal planes in accordance with an embodiment of the present invention. This type of bypass capacitor is electrically coupled to power and ground conductors on the top surface of package 204, so that step currents caused by the IC device (which is coupled to the top surface of the package) enter and leave the plurality of bypass capacitors through the top surface of package 204. Note that the internal planes (402 and 404) of the bypass capacitor extend downward from the top surface of package 204 in a direction that is normal to the top surface of package 204. (Although only two planes 402 and 404 are illustrated in FIG. 4, there are actually many more underlying planes which are not illustrated.)

Current flow through this new type of bypass capacitor is illustrated by arrows in FIG. 4. Forward current flow into the bypass capacitor is illustrated by solid arrows, and return current flow out of the bypass capacitor is illustrated by dashed arrows.

Inductance through these current paths is very low, because current flows in the opposite direction in adjacent planes, which causes the inductive flux to cancel. Furthermore, there are many parallel planes through which the current can flow; this further reduces inductance. Note that all of the features that lead to high capacitance (close plane spacing, many planes in parallel) are also ideal for making the inductance involved in moving from one lead of the capacitor to the other lead of the capacitor very low. Also note that current can flow downward in this type of capacitor to gain access to more capacitance without generating a significant amount of additional inductance.

More specifically, inductance, L, is given by the following formula.

$$L = (length * thickness)/(width * N\_dielectrics)$$

where, "length" is the path length of the planes; "thickness" is dielectric thickness or plane separation; "width" is the width of the planes; and "N_dielectrics" is the number of dielectrics in the capacitor. Note that in the present invention the path length through the planes (length) is relatively low, distance between the planes (thickness) can be very low, and the number of dielectrics (N_dielectrics) can be very large.

Bypass Capacitor Incorporated into Power and Ground Leads

Figure 5:
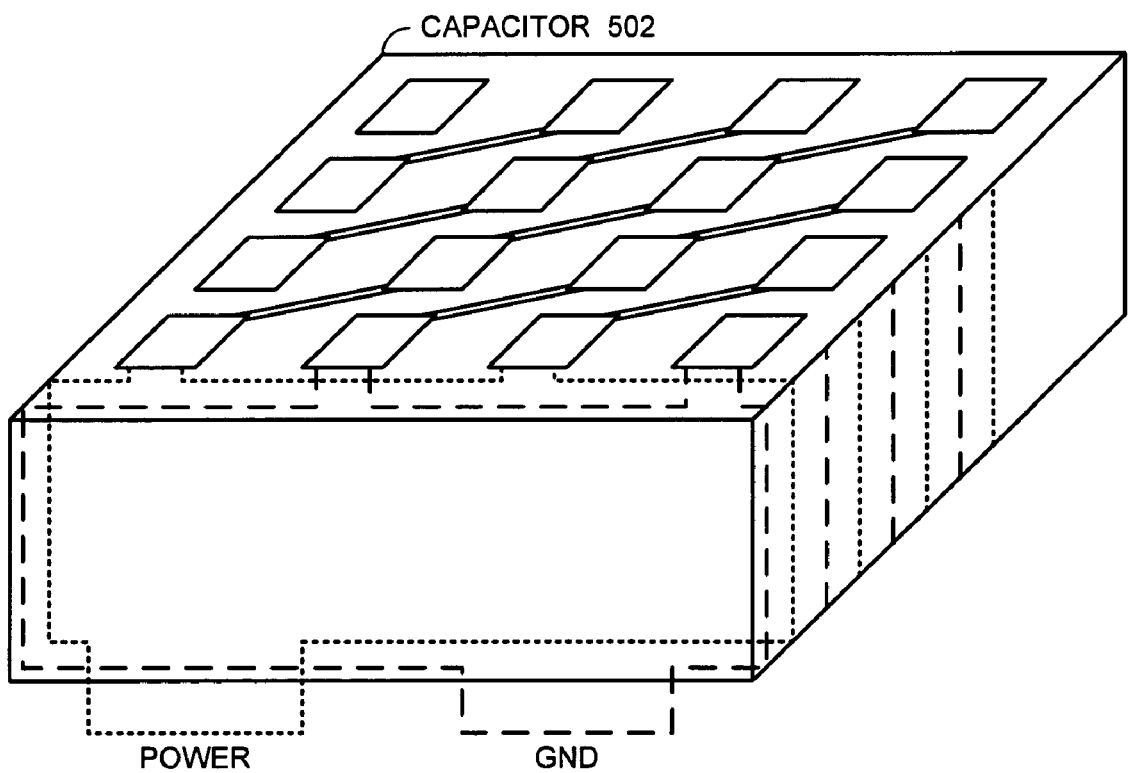
FIG. 5 illustrates how bypass capacitors can be incorporated into power and ground leads in a package in accordance with an embodiment of the present invention.

FIG. 5 illustrates how bypass capacitors can be incorporated into power and ground leads in accordance with an embodiment of the present invention. In this embodiment, the ends of the internal planes of the bypass capacitors, which are located farthest from the top the package, are electrically connected to power and ground conductors on the bottom surface of the package. In this way, the internal planes of the bypass capacitors function as power and ground leads that electrically couple power and ground lines from the circuit board with power and ground pins on the IC device. Also note how diagonal straps on the top surface of the capacitor are used to electrically couple the power planes together and to electrically couple the ground planes together. Furthermore, there can possibly be a metal side plane (or metal strips) on the left-hand side of capacitor 502 connecting the ground planes together, and a metal side plane (or metal strips) on the right-hand side of capacitor 502 connecting power planes together.

Furthermore, note that the bypass capacitors described in this specification can be configured as an array of bypass capacitors, instead of being configured as single bypass capacitors.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus for reducing voltage noise for an integrated circuit (IC) device, comprising:

a package which is configured to be sandwiched between the IC device and a circuit board, wherein the package has a bottom surface, which is configured to receive electrical connections for power, ground and other signals from the circuit board, and a top surface, which is configured to provide electrical connections for power, ground and the other signals to the IC device, wherein the package includes:

a substrate comprised of a bulk material;

top buildup layers on a top surface of the package which include traces for routing power, ground and other signals between the IC device and vias that pass through the substrate; and bottom buildup layers on a bottom surface of the package which include traces for routing power, ground and other signals between the vias that pass through the substrate and the circuit board; and a plurality of bypass capacitors, each including a set of internal planes, integrated into the substrate in the package between the top buildup layers and the bottom buildup layers and coupled between the power and ground connections for the IC device, so that the plurality of bypass capacitors reduce voltage noise between the power and ground connections for the IC device, wherein the internal planes of the bypass capacitors extend downward from the top surface of the substrate in the package in a direction that is normal to the top surface of the substrate in the package.

2. The apparatus of claim 1, wherein the top buildup layers are comprised of an organic material.

3. The apparatus of claim 1, wherein the substrate is:

printed circuit board substrate; or is comprised of a copper bulk material.

4. The apparatus of claim 1, wherein the bypass capacitors axe electrically coupled to power and ground conductors on the top surface of the package, so that step currents caused by the IC device (which is coupled to the top surface of the package) enter and leave the bypass capacitors through the top surface of the package.

5. The apparatus of claim 1, wherein the IC device is a "flip chip" semiconductor die.

* * * * *

UNITED STATES PATENT AND TRADEMARK OFFICE
CERTIFICATE OF CORRECTION

| | | |
|---|---|---|
| PATENT NO. | : 7,446,389 B2 | Page 1 of 1 |
| APPLICATION NO. | : 11/178152 | |
| DATED | : November 4, 2008 | |
| INVENTOR(S) | : William P. Cornelius | |

It is certified that error appears in the above-identified patent and that said Letters Patent is hereby corrected as shown below:

In claim 4 (at column 6, line 49), please replace the word "axe" with the word --are--.

Signed and Sealed this

Tenth Day of February, 2009

JOHN DOLL
*Acting Director of the United States Patent and Trademark Office*